United States Patent [19]

Gulko et al.

[11] 4,101,923

[45] Jul. 18, 1978

[54] SOLAR CELLS

[76] Inventors: Arnold G. Gulko; Jacob H. Steinberg, both of 2001 Jeff. Davis, #609, Arlington, Va. 22202

[21] Appl. No.: 780,287

[22] Filed: Mar. 22, 1977

[51] Int. Cl.² ............................................. H01L 27/14
[52] U.S. Cl. ........................................ 357/30; 357/63; 357/91; 357/64
[58] Field of Search ....................... 357/30, 63, 91, 64

[56] References Cited

U.S. PATENT DOCUMENTS

| | | | |
|---|---|---|---|
| 3,502,515 | 3/1970 | McMullen | 148/175 |
| 3,990,100 | 11/1976 | Mamine | 357/30 |
| 4,003,770 | 1/1977 | Janowiecki | 148/174 |
| 4,004,949 | 1/1977 | Lesk | 148/1.5 |
| 4,028,720 | 6/1977 | Pankove | 357/30 |

OTHER PUBLICATIONS

Sze, Physics of Semiconductor Devices, p. 30, John Wiley & Co., N. Y., N. Y., 1969.
Hannay, Semiconductors, Rheinhold Co., N. Y., 1960, p. 342.

Primary Examiner—Martin N. Edlow

[57] ABSTRACT

A solar cell is provided which comprises a layer of crystalline silicon doped with boron on at least one surface thereof and having the other surface doped with vanadium.

8 Claims, 1 Drawing Figure

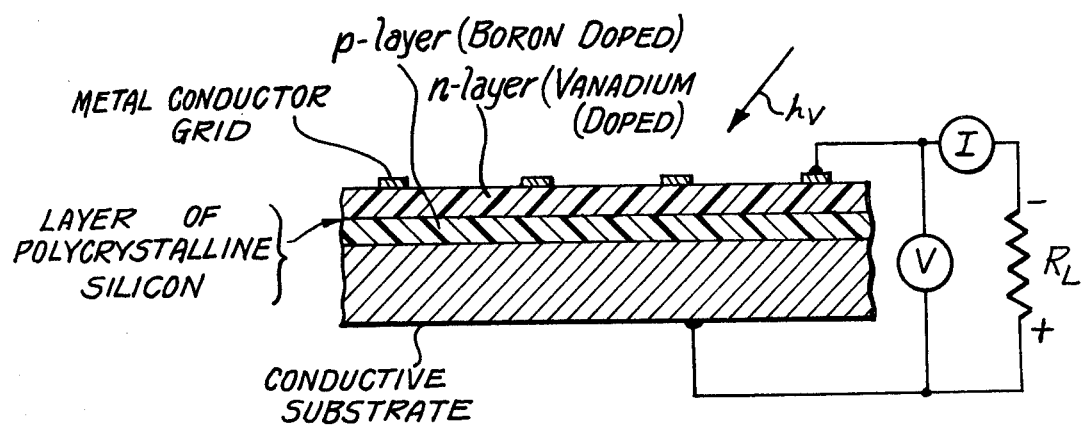

SOLAR CELLS

The present invention relates to solar cells, and particularly to semiconductor material forming a part of such solar cells and which is capable of converting a greater proportion of incident solar energy into electrical energy.

Phosphorus has been conventionally used in silicon-based solar cells to provide the electron-releasing component in the n-type portion of the semiconductor. Unfortunately, these solar cells possess an excessive band gap, and thus a large proportion of the solar energy which impinges upon the cell is only capable of producing heat and is incapable of releasing an electron to form part of the electrical current which it is desired to generate. This is particularly important since the proportion of incident energy having a high enough energy level to release an electron decreases as the quantity of air through which the solar radiation passes increases, and this means that the problem is particularly acute at low altitudes, where most people live, and in the winter and in the mornings and evenings when energy generation is most needed and when the sun's rays are at the shallowest angle which encounters the largest amount of air.

In accordance with this invention, a solar cell is provided which comprises a layer of crystalline silicon doped with boron on at least one surface thereof and having the other surface doped with vanadium. As will be understood in the art, the solar cell is constituted by a layer of appropriately doped silicon associated on its rear surface with a conductive electrode which preferably covers the entire rear surface, and the front surface is associated with a metal electrode which covers only a small proportion of the surface (usually 5-15%) so that incident light may penetrate the layer to cause the release of electrons which are carried away from the n-junction and returned via an external circuit to the p-junction of the cell.

While it is preferred to have the silicon crystal doped with boron throughout the body thereof while the vanadium is confined to one surface (either surface), this is not essential, and the preference is based on commercial availability. Indeed, it would be better to have the two dopants separated on opposite surfaces of the silicon crystal, and it is also possible to use two crystals, one doped with boron and the other with vanadium, the two crystals being adhered to one another.

The proportion of impurity required to dope a silicon crystal to provide p-type and n-type semiconductive layers therein is itself well known and is unchanged in this invention. Accordingly, these proportions will not be discussed herein. Indeed, boron-doped silicon ribbon is produced directly and it is only necessary to dope one surface thereof with vanadium, as will be discussed hereinafter, and attach appropriate electrodes to provide the solar cell of this invention.

Phosphorus is the conventional material which is used to interact with the photons of incident radiant energy, and it is known to replace it with other group VA elements, though these provide little advantage. Vanadium is not a group VA element, but it is pentavalent like phosphorus. Also, both silicon and vanadium have about the same atomic radius, and it is this which allows vanadium to be interjected into the silicon crystal structure in the same way that phosphorus is now employed. However, vanadium is importantly different from phosphorus because it will release electrons at a lower level of incident energy than does phosphorus, as is itself known because of its lower first ionization energy level. With the electron being relased at a lower level of incident energy and with the vanadium-doped layer being more conductive than the phosphorous-doped layer of the prior art, the band gap is reduced, and a larger proportion of the incident solar energy is converted to electrical energy.

A search of the prior art has uncovered only a single patent of interest to the use of vanadium in p-n semiconductive crystals, namely, U.S. Pat. No. 3,502,515, and this patent describes a semiconductor switch device in which a boron-doped silicon wafer is provided with laterally spaced zones of phosphorus dopant which is then overcoated with various metals typified by molybdenum, vanadium being included within the metals named to possibly replace the molybdenum. This switch is actuated by an externally imposed electrical current and the metal overcoating functions to speed the flow of current through the switch. While this does not teach one how to provide a solar cell in which phosphorus or like group VA element is preferably absent, as is the case herein, it is of interest because it corroborates one aspect of this invention, which is the concept that metals like vanadium will speed the flow of electrons through the semiconductor device which is one aspect of the production of a lowered band gap. Molybdenum, as in the prior patent, is useless in this invention, and vanadium has no adequate replacement among the transition metals.

The semiconductors which are relied upon herein to provide the core of the solar cells in the present invention can be prepared in various ways as is known in the art, and semiconductor production is not a feature of this invention. However, these are based on silicon in crystalline form, the term crystalline including the preferred polycrystalline form which is preferred solely because of its availability and cost.

The formation of semiconductors of the type used herein can be simply formed in various ways as is discussed in detail in U.S. Pat. No. 4,003,770 dated Jan. 18, 1977, the disclosure of which is hereby incorporated by reference. In accordance with the teachings of this patent, polycrystalline silicon semiconductors are prepared by a plasma spray process in which doped silicon particles are injected into the hot gas produced by a commercially available plasma generator to produce a spray which is deposited upon a substrate to solidify and form a polycrystalline film. In this invention, the silicon particles can be doped with vanadium and then the boron can be applied to one surface in conventional manner or the silicon particles can be doped with boron and then vanadium applied in appropriate manner. The p-n junction can be formed by diffusion or ion implantation of the dopant of opposite polarity onto the sprayed layer or by spraying doped silicon particles of opposite polarity onto the first layer to provide two adhered layers.

In addition to the use of plasma spray, the dopant, either the boron or the vanadium, may be included within the hot silicon melt which is crystallized or polycrystallized to form the silicon wafer which is used. This technique is sometimes termed zone melting.

The invention is illustrated in the accompanying drawing which schematically depicts a typical solar cell constructed in accordance with this invention. As can be seen, a conductive base is covered with a layer of boron doped silicon (p-type) over which is formed a vanadium doped silicon n-type and, finally, a metal conductor grid is formed at the exposed surface of the solar cell. Anti-reflection coatings may be used, but these are not shown.

The solar cell includes an electrical circuit wherein electrical leads are attached to the grid and the substrate and these leads are attached to a load $R_L$ which can be provided by storage batteries. When the solar cell is illuminated with sunlight, designated as $h_\nu$, the silicon is penetrated to the p-n junction by the light energy which releases electrons to the n-junction while the p-junction becomes positive. This provides an electrical current (I) which flows in the electrical circuit to charge the batteries $R_L$ and generate a voltage measured across the load.

The invention is illustrated in the following examples.

EXAMPLE 1

A boron doped silicon polycrystalline wafer is made by the process of zone melting and this wafer is then exposed to a vapor deposition using $VCl_3$ following by heating for one hour at 900° C. to diffuse the vanadium into the exposed surface of the boron doped silicon polycrystalline wafer. $VCl_4$ can also be used to vapor deposit the vanadium.

EXAMPLE 2

A vanadium doped silicon is made by the process of zone melting and upon a wafer derived from said process boron oxide is deposited and diffused into the surface thereof using a temperature of 900° C. for one hour.

EXAMPLE 3

A boron doped silicon wafer as in Example 1, has its exposed surface ion implanted with vanadium ions. Since ion implantation is relatively insensitive to crystal defects, a more uniform and very reproducible junction is obtained.

EXAMPLE 4

A ribbon of polycrystalline boron doped silicon made by the Sohio process was used as the base and a superosed ribbon of vanadium doped silicon was applied thereover and the two are heated to fuse them together.

EXAMPLE 5

A ribbon of polycrystalline boron doped silicon is exposed to ion implantation for implanting vanadium into its surface.

In each of the previous examples, the product, when place on a conductive support with a conductive grid at the exposed surface, provides a solar cell which generates electricity on radiation exposure.

EXAMPLE 6

A p-type polycrystalline silicon film is deposited on a conductive substrate (sheet steel) using plasma spraying of a boron doped silicon. After a film 6 mil in thickness is built up, the deposition is interrupted and a vanadium doped silicon is then deposited by plasma spraying over the initial film, The resulting p-n junction generates an electrical current upon illumination by incident light.

The invention is defined in the claims which follow.

What is claimed is:

1. A solar cell comprising a layer of crystalline silicon doped with boron on at least one surface thereof, and having the other surface doped with vanadium wherein a p-n junction is formed therebetween.

2. A solar cell as recited in claim 1 in which a rear surface of said layer is at least partially covered with a conducting electrode and a front surface of said layer is only partially covered with conducting electrodes.

3. A solar cell as recited in claim 2 in which the front surface of said layer is covered by said conducting electrodes to an extend of from 5–15% of the surface.

4. A solar cell as recited in claim 1 in which said layer is free of group VA elements.

5. A solar cell as recited in claim 1 in which the entire layer of crystalline silicon is doped with boron.

6. A solar cell as recited in claim 3 in which the entire rear face of said layer is covered with a conducting electrode.

7. A solar cell as recited in claim 3 in which the front surface of said layer is vanadium doped.

8. A solar cell as recited in claim 3 in which said silicon layer is polycrystalline.

* * * * *